United States Patent [19]

Shinohara et al.

[11] Patent Number: 5,394,338
[45] Date of Patent: Feb. 28, 1995

[54] MODULE CELL GENERATING DEVICE FOR A SEMICONDUCTOR INTEGRATED CIRCUIT

[75] Inventors: Hirofumi Shinohara; Hiroyuki Amishiro, both of Hyogo, Japan

[73] Assignee: Mitsubishi Denki Kabushiki Kaisha, Tokyo, Japan

[21] Appl. No.: 805,139

[22] Filed: Dec. 11, 1991

[30] Foreign Application Priority Data

Dec. 17, 1990 [JP] Japan ................. 2-402947

[51] Int. Cl.⁶ .............................................. G06F 15/60
[52] U.S. Cl. ..................................... 364/491; 364/488
[58] Field of Search ............... 364/488, 484, 490, 491, 364/578

[56] References Cited

U.S. PATENT DOCUMENTS

| | | | |
|---|---|---|---|
| 5,031,111 | 7/1991 | Chao et al. | 364/491 |
| 5,097,422 | 3/1992 | Corbin, II et al. | 364/497 |
| 5,140,526 | 8/1992 | McDermith et al. | 364/488 |
| 5,210,701 | 5/1993 | Hana et al. | 364/491 |
| 5,222,030 | 6/1993 | Dangelo et al. | 364/489 |
| 5,278,769 | 1/1994 | Bair et al. | 364/490 |

OTHER PUBLICATIONS

VLSI Design Silicon Compiler, Science Forum, pp. 120–131, no date.
Nikkei Electronics, Mar. 24, 1986, No. 391, pp. 149–158.

*Primary Examiner*—Kevin J. Teska
*Assistant Examiner*—Susan Wieland
*Attorney, Agent, or Firm*—Lowe, Price, LeBlanc & Becker

[57] ABSTRACT

A module cell generating device of a semiconductor integrated circuit includes a parameter input part for applying a designation parameter, a basic cell group storing the basic cells, and a basic cell arranging and wiring process part for generating layout designing data by utilizing a structure description part which is a control description for defining the arrangement method and the wiring method of the basic cells, the designation parameter, the structure description, and the basic cells. Furthermore, it includes a basic cell generating process part for generating the newly designated basic cells in accordance with the designation parameter.

4 Claims, 14 Drawing Sheets

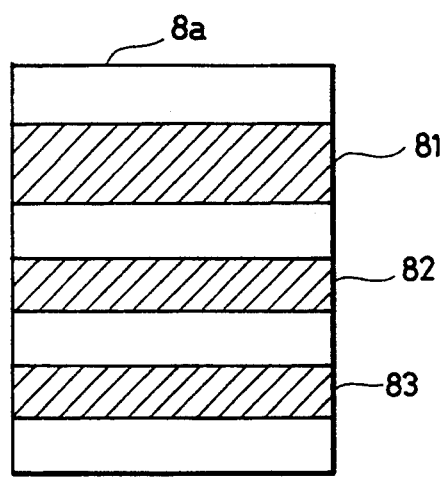
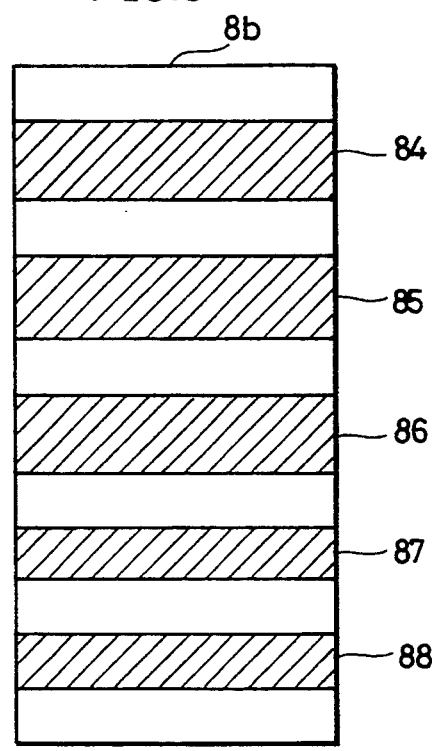

MODULE CELL GENERATING DEVICE FOR A SEMICONDUCTOR INTEGRATED CIRCUIT

BACKGROUND OF THE INVENTION

1. Field of the Invention

The present invention relates generally to module cell generating device of semiconductor integrated circuits, and more particularly, to a module cell generating device for generating layout designing data.

2. Description of the Background Art

In the semiconductor integrated circuit, there is a region called a module cell having regular layout structure such as a RAM, a ROM, a PLA, and a multiplier. In designing process of the semiconductor integrated circuit, a method of designing such a module cell is carried out by using a basic cell arranging and wiring device referred to as a module cell generating device. The module cell generating device automatically designs the layout of the module cell by providing a designation parameter characterizing each of the module cells when designing them. FIG. 10 is a system configuration diagram of the module cell generating device. Referring to FIG. 10, a conventional module cell generating device comprises a parameter input part 1, a module cell generating process part 2, and a layout designing data output part 3.

Parameter input part 1 applies a designation parameter 1a necessary for the generation of the module cell. The typical parameter, for example, is the bit number of 1 word, storage capacity, or the magnitude of the layout of module cell in the module cell of RAM.

Module cell generating process part 2 comprises a basic cell group 21, a structure description part 22, and a basic cell arranging and wiring process part 23. Basic cell group 21 stores various basic cells. The basic cell is fundamental layout designing data for constructing layout designing data. A specific example of the basic cell will be described. FIG. 11 shows a basic cell structure diagram showing one example of the basic cell 40 showing wiring structure. A basic cell 30 has two wirings 31 and 32. FIG. 12 is a structure diagram of another basic cell. A basic cell 40 comprises one transistor, a source wiring 41, a drain wiring 42, and a gate wiring 43. FIG. 12 shows the circuit diagram of the basic cell 45 shown in FIG. 13. FIG. 13 shows a transistor 51, a source 5S, a drain 5D, a gate 5G corresponding to source wiring 41, drain wiring 42, and gate wiring 43 of the basic cell shown in FIG. 12, respectively.

In structure description part 22, structure description including designation and arrangement direction repeating numbers of the basic cells used, relationship between the basic cells, and the wiring of the basic cells is programmed. Furthermore, structure description which describes about how they change in response to the designation parameter is programmed. Structure description part 22 provides various designations as mentioned above to basic cell arranging and wiring process part 23.

Basic cell arranging and wiring process part 23 generates layout designing data of the module cell in response to the basic cell applied from basic cell group 21, the structure description from structure description part 22, and designation parameter 1a applied from parameter input part 1 to provide the generated layout designing data to layout generating data output part 3.

The operation of a conventional module cell generating device will be described with reference to three examples. Generation of layout designing data shown in FIGS. 14, 15, and 16 using basic cell 30 shown in FIG. 11 and basic cell 40 shown in FIG. 12 will be described.

Let us assume that X, Y, and Z are applied as the designation parameter from parameter input part 1 at first. Let us also assume that "Basic cell 40 is arranged to Y side of a basic cell X by moving it upward for Z" is programmed in structure description part 22.

Under the condition described above, in the first example shown in FIG. 14, $X=1$, $Y=$ right, and $Z=0$ are applied as the designation parameter. Basic cell arranging and wiring process part 23 fetches basic cell 30 and basic cell 40 from basic cell group 21, implementing layout design in accordance with designation parameter 1a and structure description 22 to provide layout designing data of the pattern shown in FIG. 14 to layout designing data output part 3. The layout shown in FIG. 14 extends a source line 41 of the transistor of basic cell 40 by wiring 31 of basic cell 30, and also a gate wiring 43 by wiring 32.

In the second example shown in FIG. 15, $X=1$, $Y=$ right, and $Z=\frac{1}{2}$ are applied as the designation parameter. Layout designing data shown in FIG. 15 is generated in accordance with the designation parameter, the structure description, and the basic cell. In the layout shown in FIG. 15, gate wiring 43 of the transistor of basic cell 40 is extended to wiring 31 of basic cell 30, and wiring 32 is not connected to anywhere.

In the third example shown in FIG. 16, $X=2$, $Y=$ right, and $Z=0$ are applied as the designation parameter. Layout designing data of FIG. 16 is generated in accordance with the designation parameter, the basic cell, and the structure description. In the layout shown in FIG. 16, the gate wirings of the left and right basic cells 40 are connected by generating the same form of basic cell 40 on the right side of basic cell 40, and drain wiring 42 of the left side basic cell 40 is connected to source wiring 41 of the right side of basic cell 40. A circuit diagram corresponding to FIG. 16 is shown in FIG. 17.

As mentioned above, the conventional module generating device can automatically generate layout designing data in accordance with designation parameter 1a, basic cell group 21, and structure description 22.

However, in the conventional module cell generating device, basic cell group 21 was constituted only by the basic cells provided with their form fixed in advance. Therefore, there was a limit to layout designing data of the semiconductor integrated circuit which can be generated by the combination of these basic cells. This means that the layout designing data in combination with the basic cell not included in basic cell group 21 was not generated. In other words, in order to generate such layout designing data, the operation of storing the basic cell after creating it intentionally in basic cell group 21 was necessary for the device in addition to automatical designing operation of the module cell generating device in advance. These operations are not preferable because the number of process steps of designing operation is increased and make them more complicated.

SUMMARY OF THE INVENTION

One object of the present invention is to increase a structure patterns of module cells which can be automatically layed out in a module cell generating device.

Another object of the present invention is to provide a module cell generating device which can change a basic cell constituting the module cell.

A module cell generating device in accordance with the present invention is a device automatically carrying out arrangement of the cells and the wirings between the cells of a module cell circuit included in a semiconductor integrated circuit. The module cell generating device includes a parameter input part applying designation parameters which define the structure of the module cell. It also includes a basic cell generating part generating various forms of first basic cells in accordance with the designation parameters applied from the parameter input part. Additionally, a basic cell holding part holding the first basic cell and an existing second basic cell having a predetermined form, and a structure description process part having a structure description which defines arrangement method and wiring method of the first basic cell and the second basic cell in accordance with the designation parameters are included in the module cell generating device. Furthermore, a basic cell arranging and wiring process part arranging the first basic cell and the second basic cell fetched out from the basic cell holding part to a prescribed pattern in accordance with the designation parameter and the structure description, and generating the module cell by forming a wiring pattern, and a layout designing data output part providing layout designing data of the generated module cell are included in the module cell generating device.

In another aspect of the present invention, a method of generating the module cell includes the following steps.

Firstly, the designation parameter defining the structure of the module cell is applied.

Secondly, the first basic cell having various forms in accordance with the designation parameter is generated. Furthermore, by utilizing the first basic cell and the second basic cell which was generated and stored in advance according to the structure description, the structure pattern of the module cell is generated. Consequently, data indicating the structure pattern of the module cell is provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows a basic cell structure of one example of the basic cell of the first example generated by a basic cell generating process part of the module cell generating device in accordance with the present invention.

FIG. 3 shows a basic cell structure diagram showing another example of the basic cell of the first example generated by the basic cell generating process part of the module cell generating device in accordance with the present invention.

DESCRIPTION OF THE PREFERRED EMBODIMENTS

Figure 1:
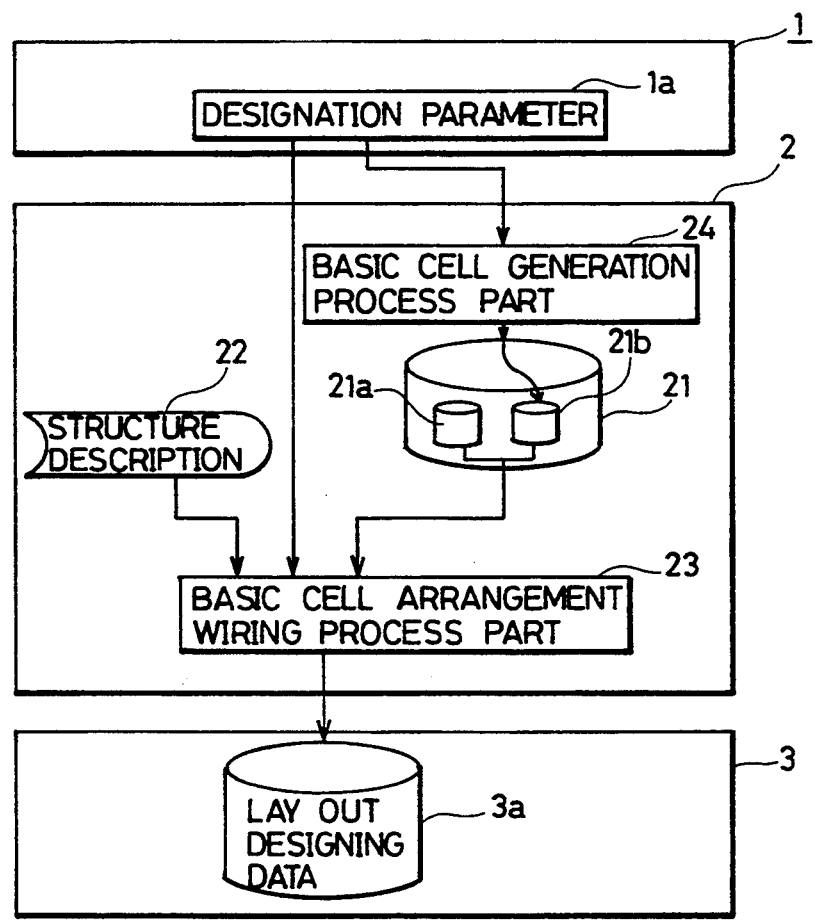
FIG. 1 is a diagram showing system structure of a module cell generating device in accordance with the present invention.

Referring to FIG. 1, a module cell generating device comprises a parameter input part 1, a module cell generating process part 2, and a layout designing data output part 3. The module cell generating device applies a designation parameter 1a, and provides layout designing data 3a in accordance with the value of designation parameter 1a.

Parameter input part 1 receives designation parameter 1a from outside to provide it to a module cell generating process part 2. An input terminal unit or an external file is used as an input means. The applied designation parameter 1a applies the designation to each of the basic cell generating process part 24 and the basic cell arranging and wiring process part 23 of module cell generating process part 2.

Module cell generating process part 2 comprises basic cell generating process part 24, a basic cell group 21, a structure description part 22, and basic cell arranging and wiring process part 23. Basic cell group 21 comprises a first basic cell group 21b storing the first basic cell generated by basic cell generating process part 24 and a second basic cell group 21a storing the basic cell provided in advance.

Basic cell generating process part 24 generates various basic cells in response to designation parameter 1a applied from parameter input part 1 to provide it to first basic cell group 21b. The generating operation of the basic cell will be described hereinafter.

In structure description part 22, structure description including designation and arrangement direction, number of repetitions, relationships between basic cells, wiring between the basic cells and the manner how they change in accordance with the designation parameter is programmed.

Basic cell arranging and wiring process part 23 carries out the layout of the module cell with designation parameter 1a applied from parameter input part 1, structure description of structure description part 22, and the basic cell applied from basic cell group 21 to provide layout designing data to layout designing data output part 3.

Generation of the basic cells in basic cell generating process part 24 will be described with some examples.

Generation of the wiring cell as shown in the first example will be described. FIGS. 2 and 3 show the wiring cell structure, showing the first pattern and the second pattern in accordance with the first example. These wiring patterns correspond to a method of generating the basic cell which is layout designing data, with the designating parameter designating that the space between a plurality of wirings should be constant, and that p big wirings and q small wirings should be placed. In the pattern of FIG. 2, (2, 1) is applied as the designation parameter, and in the pattern of FIG. 3, (2, 3) is applied as the designation parameter. Thereby, in the pattern of FIG. 2, a big wiring 81 and small wirings 82 and 83 are all arranged having the same space inbetween. In the pattern of FIG. 3, big wirings 84, 85, and 86, and small wirings 87 and 88 are all arranged having the same spaces inbetween. In addition to the method of applying the designation parameter as mentioned above, it is possible to apply, for example, the height of the basic cell as the designation parameter, to generate the basic cells holding the maximum number of wirings held in the same cell height.

Figure 4:
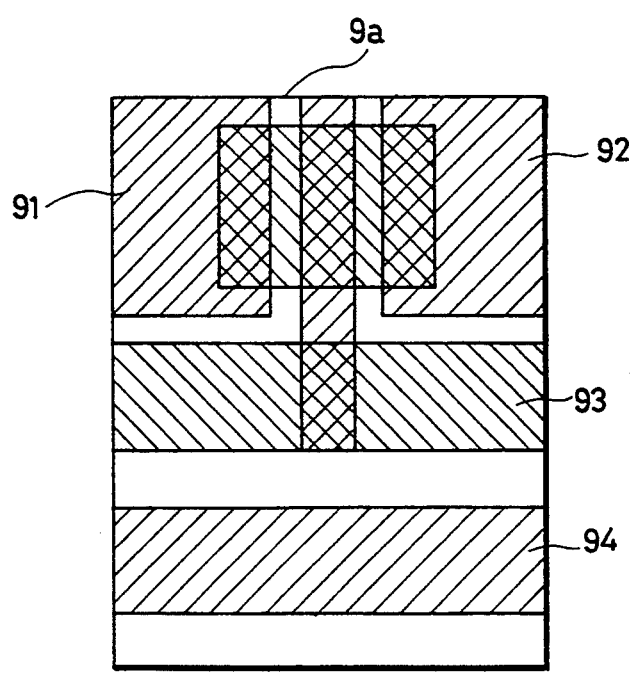
FIG. 4 shows a basic cell structure of one example of the second basic cell generated by the basic cell generating process part of the module generating device in accordance with the present invention.
Figure 5:
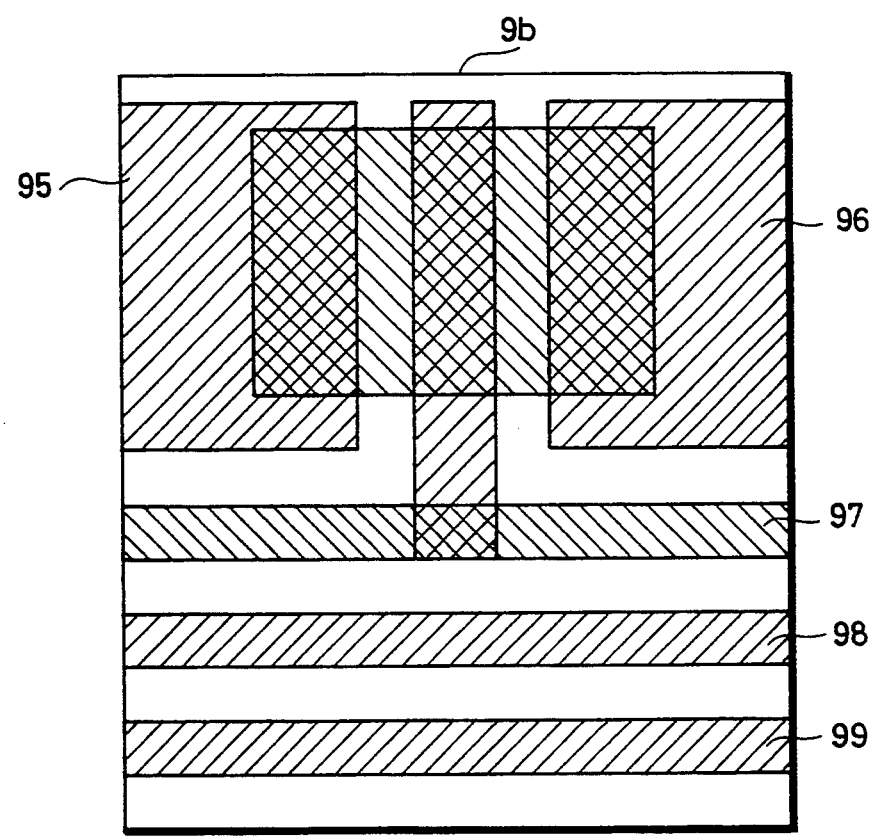
Fig. 5 shows a basic cell structure of another example of the second basic cell generated by the basic cell generating process part of the module cell generating device in accordance with the present invention.

The method of generating a second basic cell will be described. FIGS. 4 and 5 shows the basic cell structures having variable output drive capability. In this example, output drive capability is provided by the designation parameter, and layout designing data is generated in accordance with the designation parameter by basic cell generating process part 24. FIG. 4 shows a basic cell structure of layout designing data generated when drive capability is small. FIG. 5 shows a basic cell structure of layout generating data generated when drive capability is big. As shown in FIG. 4, a basic cell 9a when drive capability is small has smaller transistor than in a basic cell 9b when drive capability is big. In both figures, the source wirings 91 and 95, the drain wirings 92 and 96, the gate wirings 93 and 97 in the transistors, and the wirings 94, 98 and 99 are respectively shown. In FIG. 4, one wiring is generated, and in FIG. 5, two wirings are generated.

Figure 6:
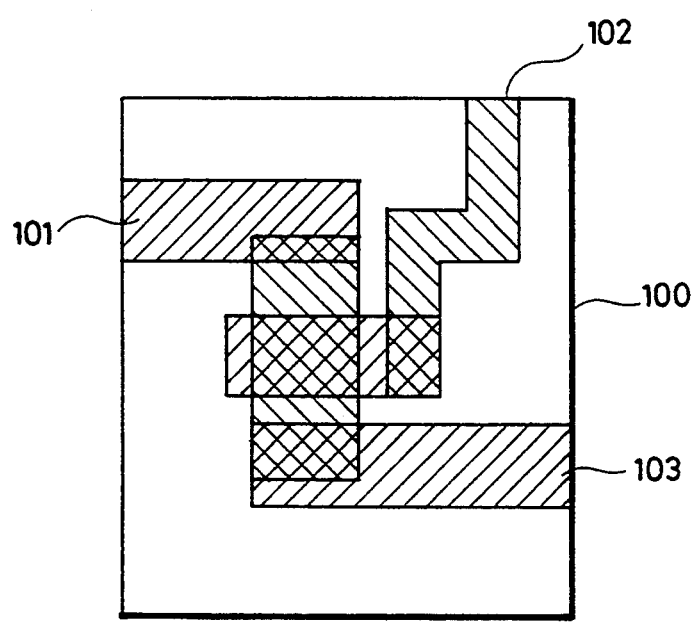
FIG. 6 shows a basic cell structure of yet another example of the basic cell of the third example generated by the basic cell generating process part of the module cell generating device in accordance with the present invention.

Furthermore, as a third example, an example of generating the basic cell by designating arrangement and wiring in the basic cell in accordance with the designation parameter will be described. FIG. 6 shows a basic cell structure diagram generated by designation method as mentioned above. A basic cell 100 has a transistor, and a source wiring 101, a gate wiring 102, and a drain wiring 103 connected thereto.

In this manner, it is possible to generate various basic cells in basic cell generating process part 24 by designating magnitude of the basic cell and the number of the wirings passing through them, or by designating other parameters characterizing basic cells. Basic data generated in basic cell generating process part 24 is stored in a first basic cell group 21b, and fetched out in a second basic cell group 21a as well as in basic cell arranging and wiring process part 23 to construct layout designing data.

The entire operation of the module cell generating device including the operation of basic cell generating process part 24 as mentioned above will be described. For example, referring to FIG. 1, designation parameter 1a is applied from parameter input part 1. One part of designation parameter 1a applies designation to basic cell generating process part 24 to generate a new basic cell necessary for the layout designing data generation, and applies it to first basic cell group 21b. In structure description part 22, a structure description which is the control description defining arrangement method and wiring method of the basic cell are programmed. Basic cell arranging and wiring process part 23 gathers the basic cell newly generated and the basic cell provided in advance of basic cell group 21 in accordance with this structure description and designation parameter 1a to generate layout designing data. Generated layout designing data is provided to layout designing data output part 3. Provided layout designing data 3a is provided to other integrated circuit manufacturing device, for example, after it is subjected to the diagram edition converting process, the data converting process or the like.

Figure 7:
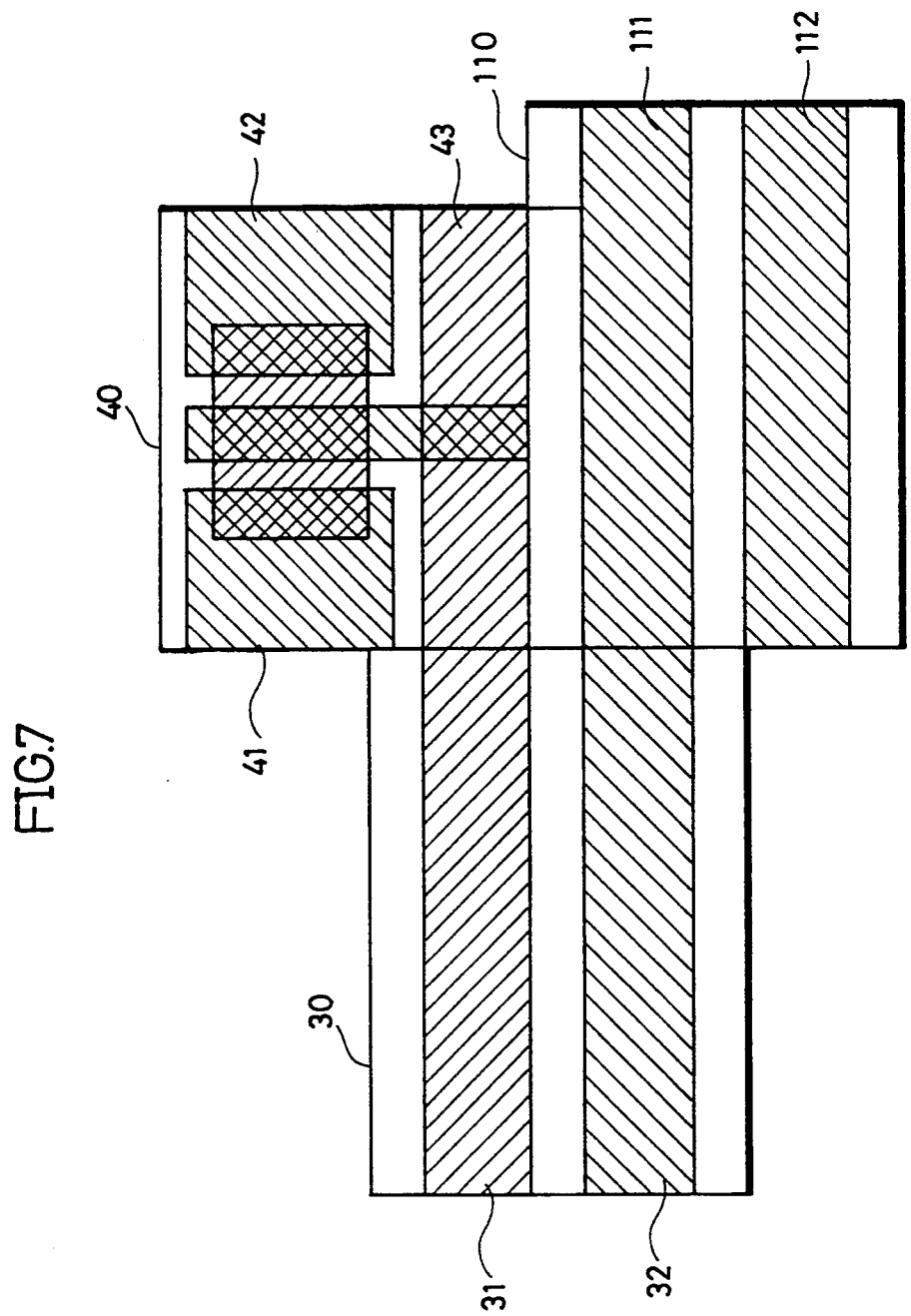
FIG. 7 show a structure diagram of layout designing data generated by the conventional module cell generating device.
Figure 9:
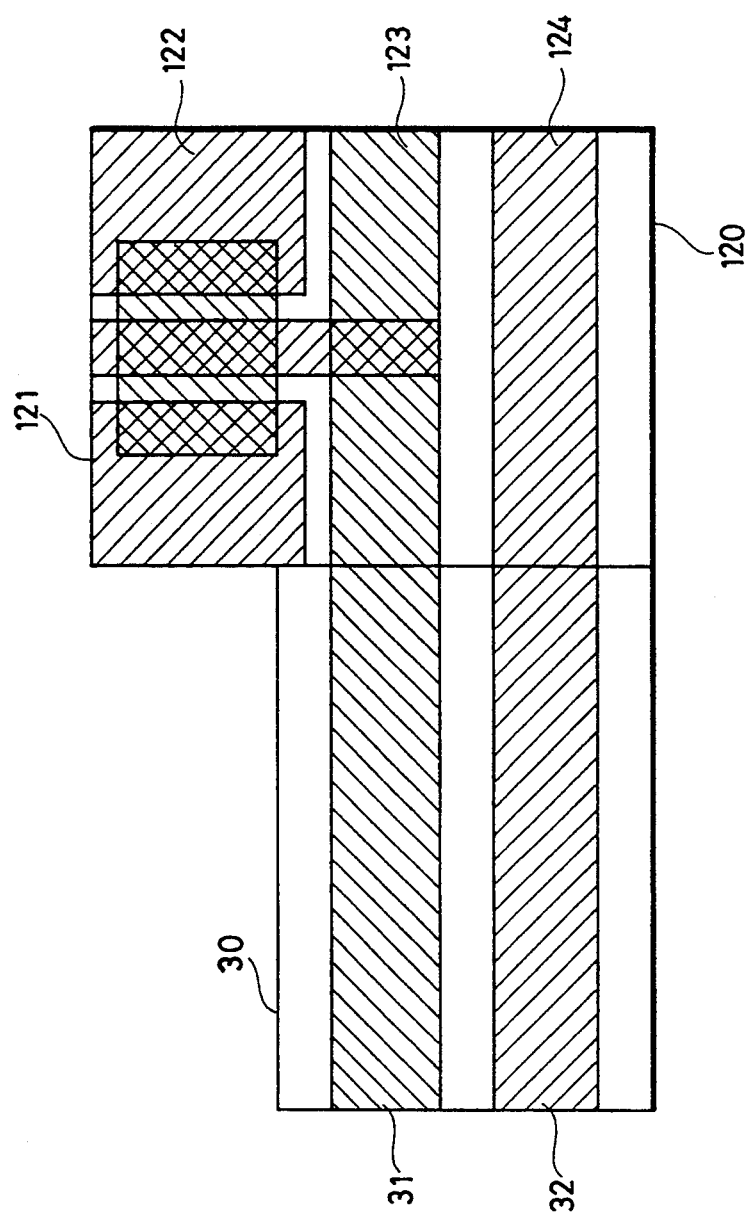
FIG. 9 shows a structure of layout designing data generated by the module cell generating device in accordance with the present invention.
Figure 10:
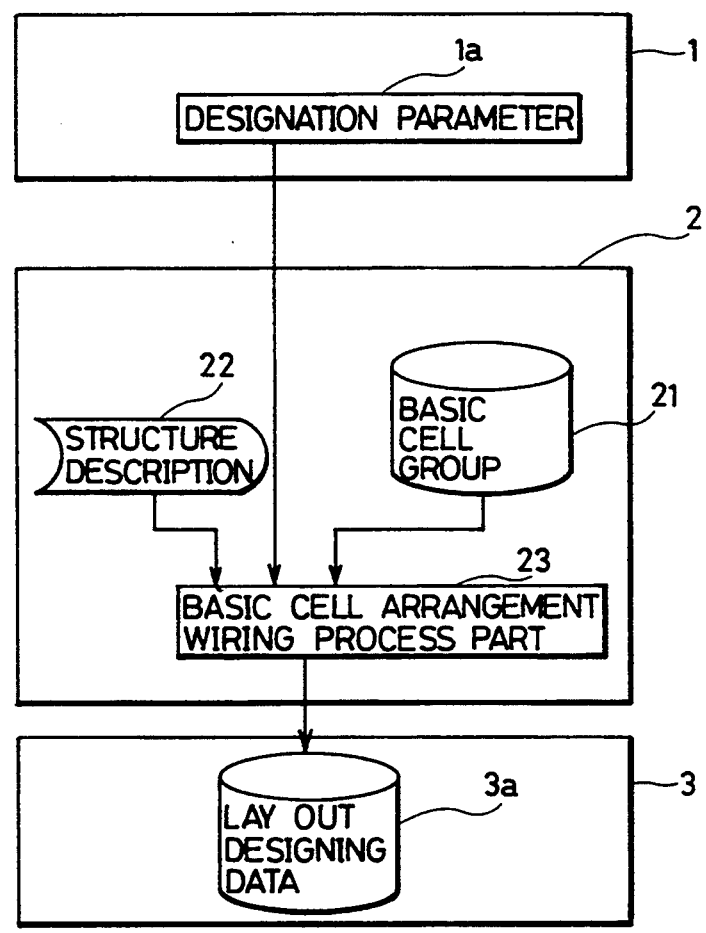
FIG. 10 is a diagram showing system structure of the conventional module cell generating device.

In this manner, the module cell generating device in accordance with the present invention can generate layout designing data more efficiently than the conventional module cell generating device, since it has basic cell generating process part 24. This will be described. As an example of layout designing data used in the description, data having the gate wiring of the transistor extended and having one wiring in parallel with it will be used. FIG. 7 shows a structure of layout designing data generated by the conventional module cell generating device. FIG. 9 shows a structure of layout designing data generated by the module cell generating device in accordance with the present invention.

Figure 11:
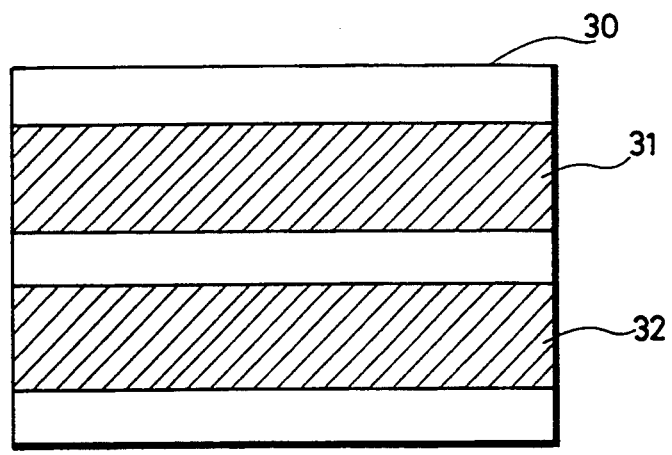
FIG. 11 shows a wiring structure of the basic cell of the conventional module cell generating device.
Figure 12:
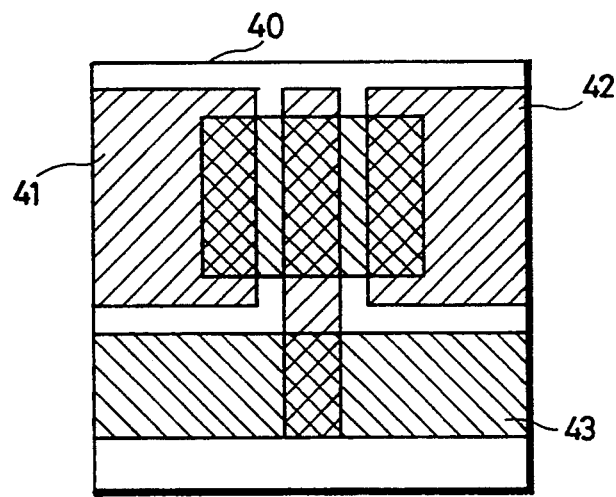
FIG. 12 shows a structure of the basic cell comprising the transistor of the conventional module cell generating device.
Figure 13:
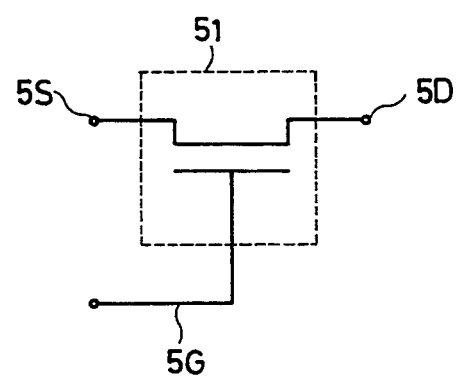
FIG. 13 is a circuit diagram of the basic cell shown in FIG. 12.
Figure 14:
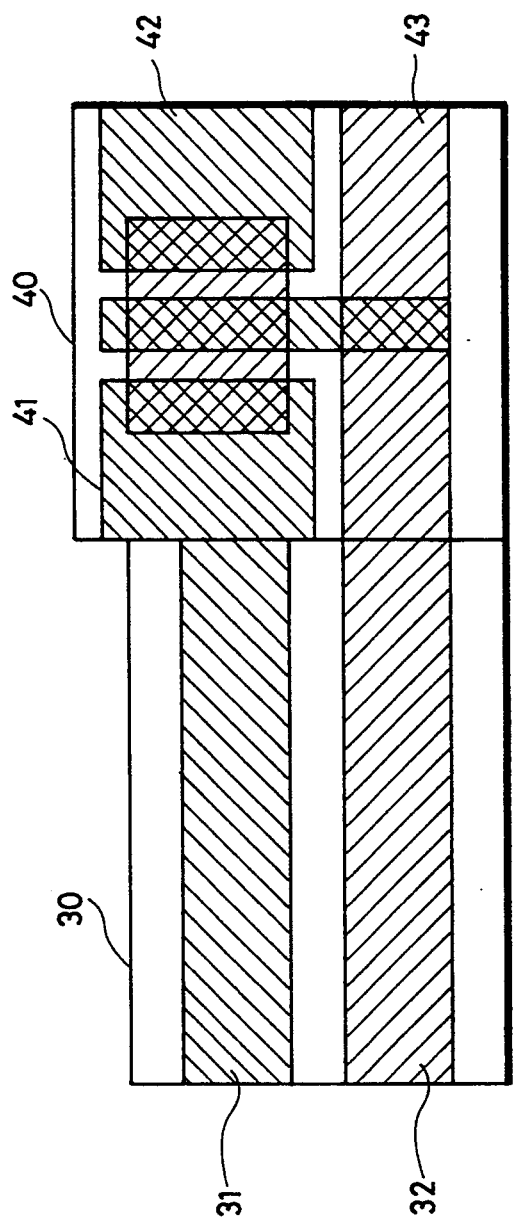
FIG. 14 shows a structure of layout designing data generated by the conventional module cell generating device.
Figure 15:
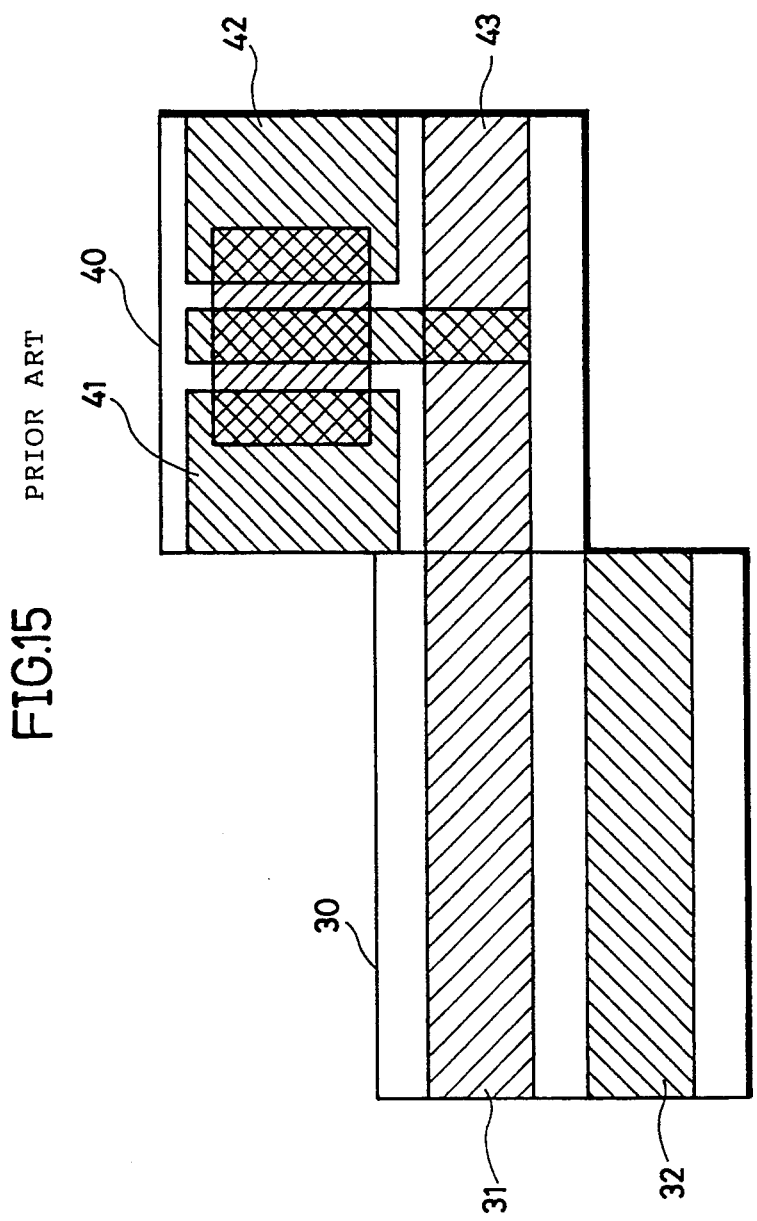
FIG. 15 shows a structure of another example of layout designing data generated by the conventional module cell generating device.
Figure 16:
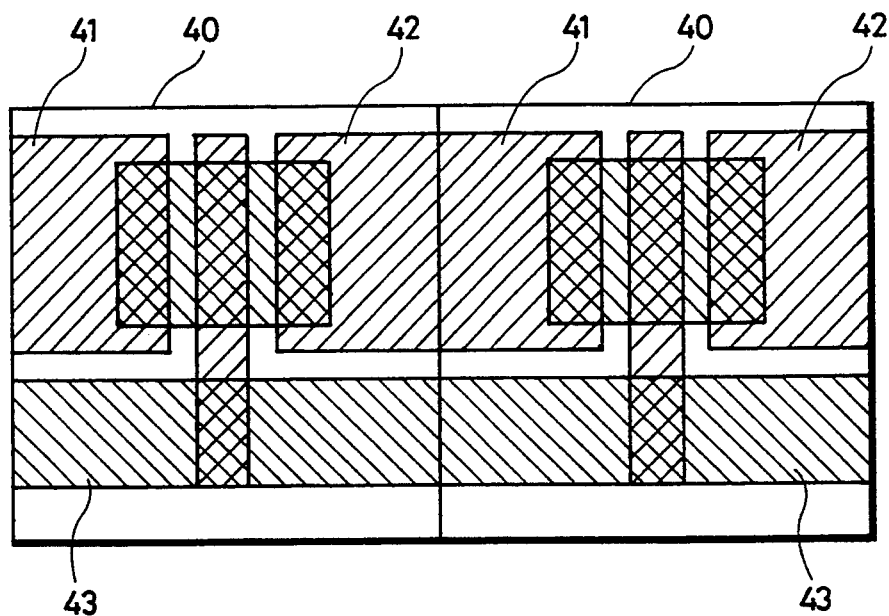
FIG. 16 shows a structure of yet another example of layout designing data generated by the conventional module cell generation device.
Figure 17:
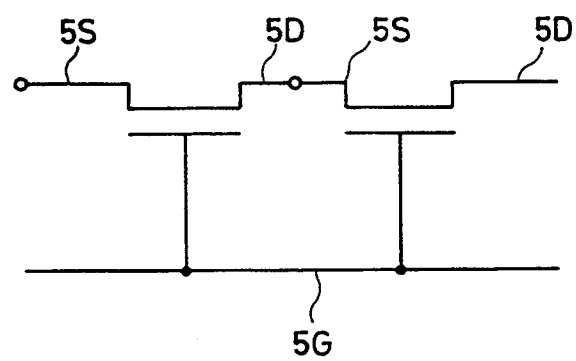
FIG. 17 is a circuit diagram of layout designing data shown in FIG. 16.

Referring to FIG. 7, when the conventional module cell generating device is used, layout designing data is generated as shown in the figure in combination with the predetermined form of basic cells 30, 110, and 40. Each of these basic cells 30, 110, and 40 corresponds to the basic cells described in FIGS. 11 and 12 of the "Description of the background Art". In the conventional example, an uncontinuous wiring 112 is generated in addition to wirings 111 and 32 extended in parallel with the gate wirings 43 and 31.

Figure 8:
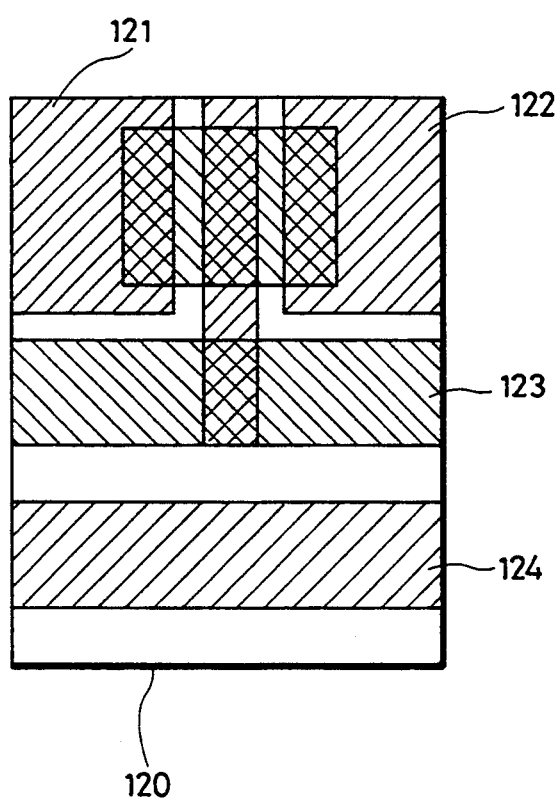
FIG. 8 shows a basic cell structure of the basic cell group generated by the basic cell generating process part of the module cell generating device in accordance with the present invention.

In the layout designing data using a module cell generating device in accordance with the present invention shown in FIG. 9, undesired wiring layout as was generated in the conventional device will not be generated. This is because, in the present embodiment, a newly provided basic cell 120 shown in FIG. 8 is constructed to form layout designing data shown in FIG. 9. A basic cell 120 shown in FIG. 8 has a source wiring 121, a drain wiring 122, a gate wiring 123, and a wiring 124 extended in parallel with gate wiring 123. Therefore, as shown in FIG. 9, a gate wiring 123 is connected to a wiring 31 of a wiring cell 30, and a wiring 124 is connected to a wiring 32. It should be clear that by comparing FIGS. 7 and 9, layout designing data generated by the module cell generating device in accordance with the present invention eliminates wasteful areas as compared with the conventional one, and makes possible more efficient layout designs.

As mentioned above, the module cell generating device in accordance with the present invention has a basic cell generating process part newly generating the basic cell in accordance with the designation parameter, and it is constructed to create layout designing data with the basic cell generated by the basic cell generating process part and the basic cell provided in advance. Therefore, the generation of more efficient layout designing data eliminating the wastes of the layout becomes possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A module cell generating device for a semiconductor integrated circuit automatically carrying out arrangement of cells and wiring between the cells of a module circuit included in the semiconductor integrated circuit, comprising:

parameters input means for applying designation parameters which define the structure of a module cell;

basic cell generating means for creating one or more custom first basic cells and for generating various forms of said one or more first basic cells in accordance with said designation parameters applied from said parameter input means;

basic cell holding means for holding said custom first basic cells and existing second basic cells having pre-established forms;

structure description means having a structure description which defines arrangement method and wiring method of said first basic cell and said second basic cell in accordance with said designation parameter;

basic cell arranging and wiring means for arranging said first basic cell and said second basic cell fetched out from said basic cell holding means to a prescribed pattern in accordance with said designation parameter and said structure description, and for generating the module cell by forming a wiring pattern; and layout designing data output means for providing layout designing data of the module cell generated by said basic cell arranging and wiring means.

2. The module cell generating device according to claim 1,
wherein said basic cell holding means includes a storage device storing data representing a structure of a first basic cell and a second basic cell.

3. A generating method of a module cell included in a semiconductor integrated circuit, comprising the steps of:

applying designation parameters which define the structure of a module cell;

generating during a design session one or more custom first basic cells having various forms in accordance with said designation parameters;

generating a structure pattern of said module cell according to a structure description by utilizing said custom first basic cells and second basic cells generated and stored prior to said session; and providing data of the structure pattern of said module cell.

4. The generating method of a module cell according to claim 3,
wherein said designation parameter includes a parameter defining the size and the quantity of an element constructing said first basic cell.

* * * * *